(12) United States Patent
Moser

(10) Patent No.: US 6,279,130 B1
(45) Date of Patent: Aug. 21, 2001

(54) EXTERNAL TRIGGER DELAY COMPENSATION APPARATUS

(75) Inventor: Michael F. Moser, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/303,184

(22) Filed: Apr. 30, 1999

(51) Int. Cl.[7] .................................................. G06F 11/00
(52) U.S. Cl. ............................................ 714/724; 324/73.1
(58) Field of Search ..................... 714/724, 731; 324/73.1

(56) References Cited

U.S. PATENT DOCUMENTS 4,730,314 * 3/1988 Noguchi .
4,972,138 * 11/1990 Bush .
5,001,714 * 3/1991 Stark et al. .

\* cited by examiner

Primary Examiner—Phung M. Chung
(74) Attorney, Agent, or Firm—Thomas F. Lenihan

(57) ABSTRACT

A trigger delay compensation arrangement for use in a digital storage oscilloscope, includes a trigger circuit for receiving a TRIGGER OUT signal generated from a logic analyzer in response to a logic analyzer trigger event signal, for starting a post trigger counter. It also includes a data entry circuitry for entering data input by a user, the data being representative of a delay between a reception of the logic analyzer trigger event signal and the generation of the TRIGGER OUT signal by the logic analyzer. A post trigger counter stops an acquisition of signal data upon expiration of a count of the post trigger counter. A controller, coupled to the data entry circuitry and to the post trigger counter receives the delay representative data, and adjusts the count of the post trigger counter in a direction to compensate for the delay. The compensation delay allows display circuitry to display a portion of the acquisition that is centered about the logic analyzer trigger event, rather than the DSO trigger event.

10 Claims, 5 Drawing Sheets

EXTERNAL TRIGGER DELAY COMPENSATION APPARATUS

FIELD THE INVENTION

The subject invention concerns the field of test and measurement equipment in general, and triggering apparatus for such test and measurement equipment in particular.

BACKGROUND OF THE INVENTION

It is quite common when troubleshooting an electronics unit to employ multiple pieces of test equipment simultaneously in an effort to identify the cause of faulty operation of the electronics unit. In this regard, it is often advantageous for a user to trigger one test and measurement instrument from another (or from an external source). For example, a user may want to use a TRIGGER OUT signal from a logic analyzer to trigger an oscilloscope. In this way, the user can set up the logic analyzer to capture a series of data words upon the occurrence of a particular binary word, and also produce the TRIGGER OUT signal to cause an oscilloscope to acquire a waveform related in time to the captured logic analyzer data record.

In sharp contrast to the simple example given above, modern logic analyzers have powerful multistate triggering capability that provides triggering on a particular sequence of events leading to a fault.

Unfortunately, a problem arises in that the generation of the TRIGGER OUT signal from the logic analyzer is delayed in time by a significant amount due to the time required for internal processing of the triggering event. This causes the oscilloscope to trigger at a delayed trigger point rather than at the earlier desired point in time coinciding with the triggering event.

It is known to apply a test signal with an unambiguous trigger event therein simultaneously to both the logic analyzer and the oscilloscope, for the purpose of determining the length of the TRIGGER OUT signal delay. After having determined the value of the internal delay, (and any additional delay caused by the length of the TRIGGER OUT signal cable), the user can compensate by searching backward through the stored oscilloscope waveform images to a point displaced from the actual trigger point by a time period equal to the delay period.

Currently, in order to actually accomplish this task, a user must calculate the location of the point in waveform memory at which the desired trigger should have occurred. It should be noted that the calculations performed are only valid for a given time base setting. If the user adjusts the oscilloscope time base controls, then the calculations must be performed again Most importantly, it should also be understood that when the desired point in memory is reached (usually by rotating a dial or knob to search through memory), there is no visual indication (i.e., marker) displayed on-screen to identify the desired point to the user. Thus there is a certain amount of uncertainty for the user, that the task of searching through memory to locate a specific point (i.e., the trigger event point) was successfully accomplished.

Unfortunately, the oscilloscope has no way of knowing that it has been triggered by a delayed TRIGGER OUT signal. Thus, it is not currently possible for an oscilloscope to display the data acquired at the desired trigger point, because the oscilloscope does not receive the necessary information that would allow it to calculate and generate this marker.

SUMMARY OF THE INVENTION

A Trigger delay compensation apparatus for use in a digital storage oscilloscope, includes a trigger circuit for receiving a TRIGGER OUT signal generated from a logic analyzer in response to a logic analyzer trigger event signal, for starting a post trigger counter. It also includes a data entry circuitry for entering data input by a user, the data being representative of a delay between a reception of the logic analyzer trigger event signal and the generation of the TRIGGER OUT signal by the logic analyzer. A post trigger counter stops an acquisition of signal data upon expiration of a count of the post trigger counter. A controller, coupled to the data entry circuitry and to the post trigger counter receives the delay representative data, and adjusts the count of the post trigger counter in a direction to compensate for the delay. The compensation delay allows display circuitry to display a portion of the acquisition that is centered about the logic analyzer trigger event, rather than the DSO trigger event.

DETAILED DESCRIPTION OF THE EMBODIMENT

Figure 1:
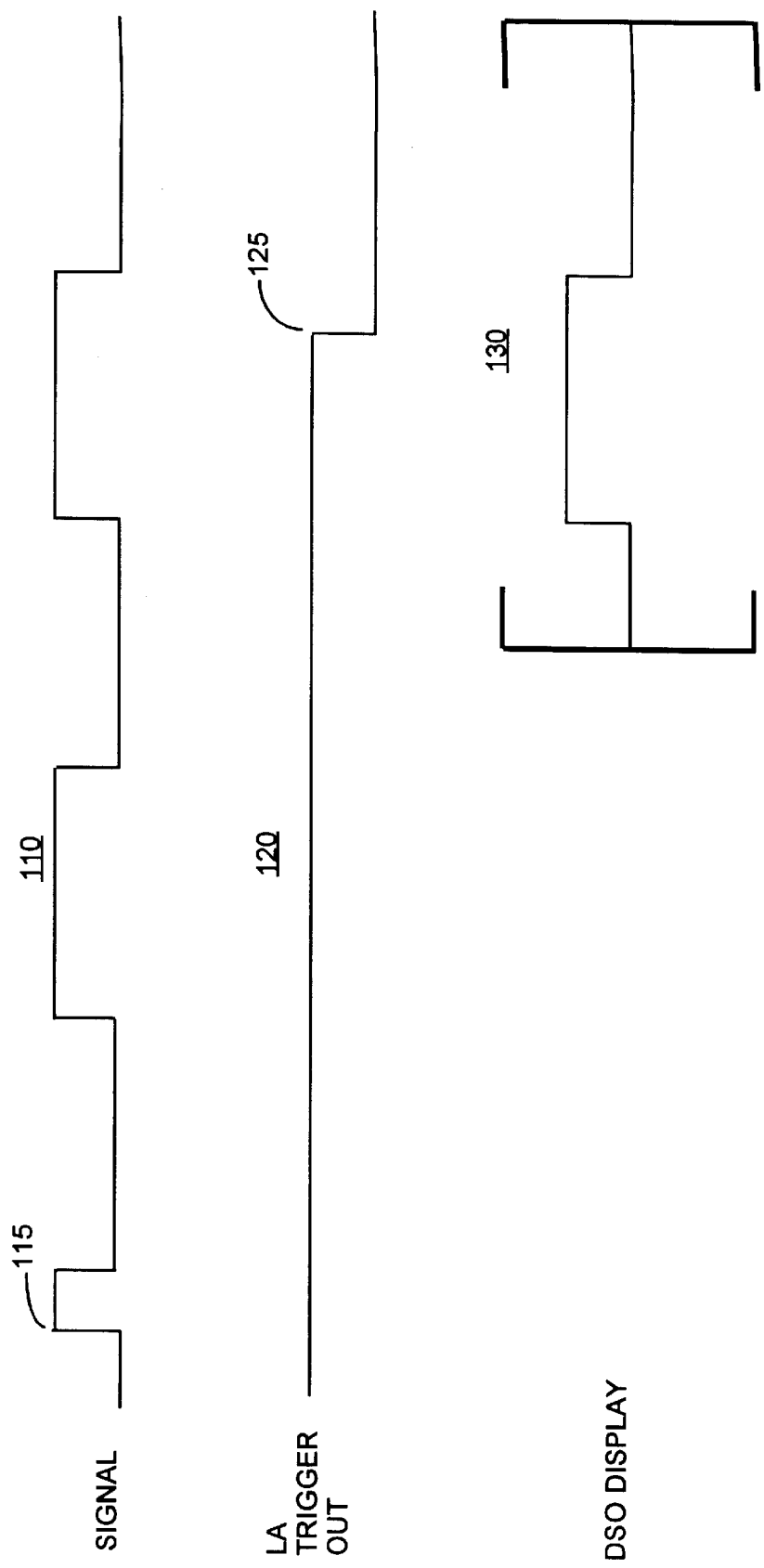
FIG. 1 is an illustration of waveforms useful in understanding the problem to be solved, and known from the prior art.

The problem described above wherein an oscilloscope is triggered by a delayed logic analyzer TRIGGER OUT signal is illustrated in prior art FIG. 1. In FIG. 1 waveform 110 illustrates a signal containing a logic analyzer trigger event 115. Waveform 120 is a signal illustrating the state of the logic analyzer TRIGGER OUT signal, having a filling-edge transition 125. Waveform 130 is a representation of an acquisition for display on a digital storage oscilloscope (DSO). Clearly, the user is interested in the data acquired around the logic analyzer trigger event 115 occurred. Unfortunately, internal processing time delays the TRIGGER OUT signal 125 for a significant time (approximately 400 ns). Thus, an acquisition centered about the logic analyzer trigger event 115 is not displayed.

Figure 2:
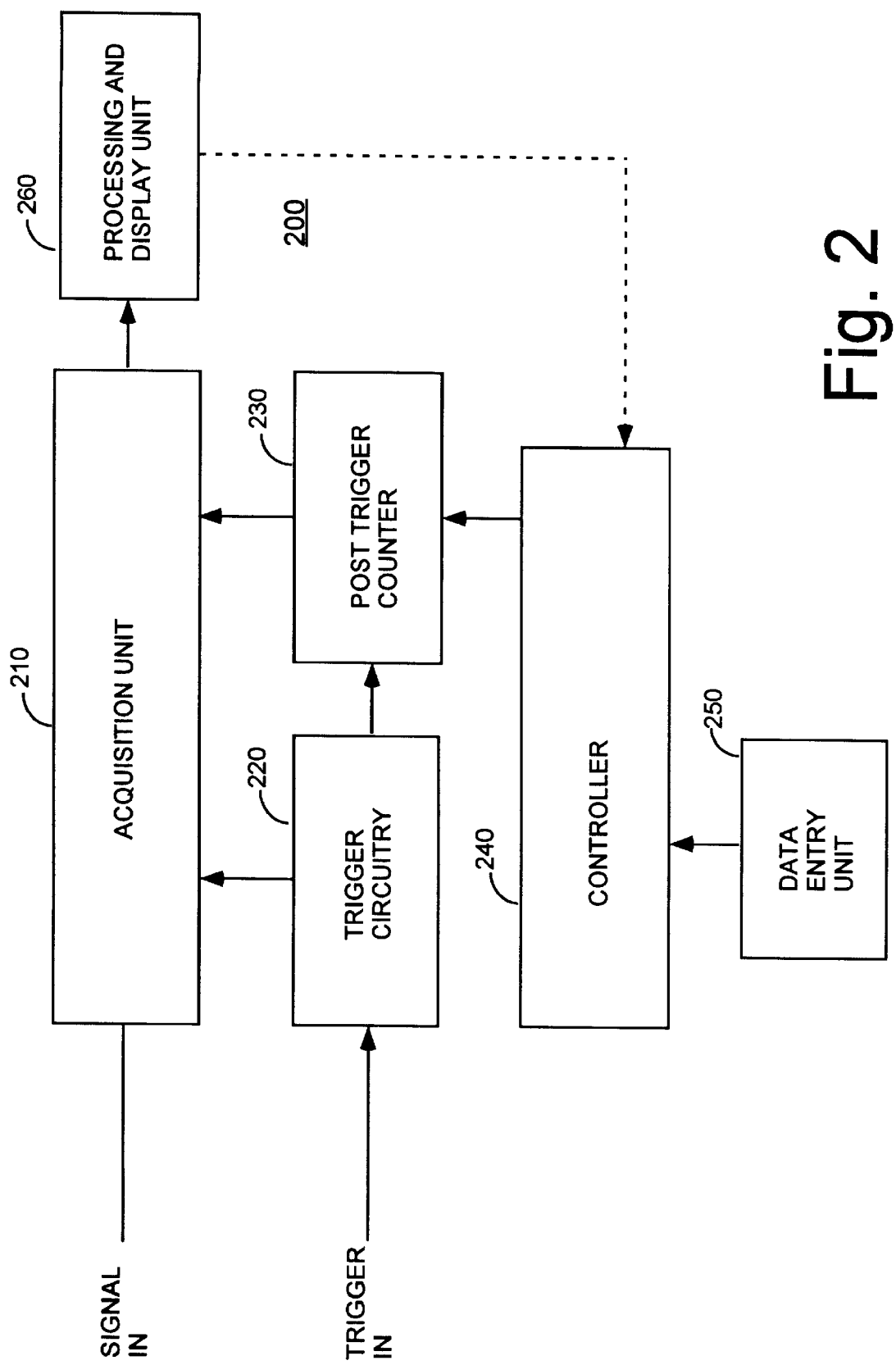
FIG. 2 is a simplified block diagram of components of a digital storage oscilloscope.

Referring to prior art FIG. 2, A modern digital storage oscilloscope (DSO) 200 includes, among other components, an acquisition unit 210 including a memory 212, a trigger unit 220, and a post trigger counter 230, and may provide other controller circuitry 240 (shown in phantom and to be described later). The post trigger counter starts counting when the trigger unit detects a trigger event and stops the acquisition unit when it reaches a terminal count. The acquired data is the data captured just before the acquisition unit is stopped.

Figure 3:
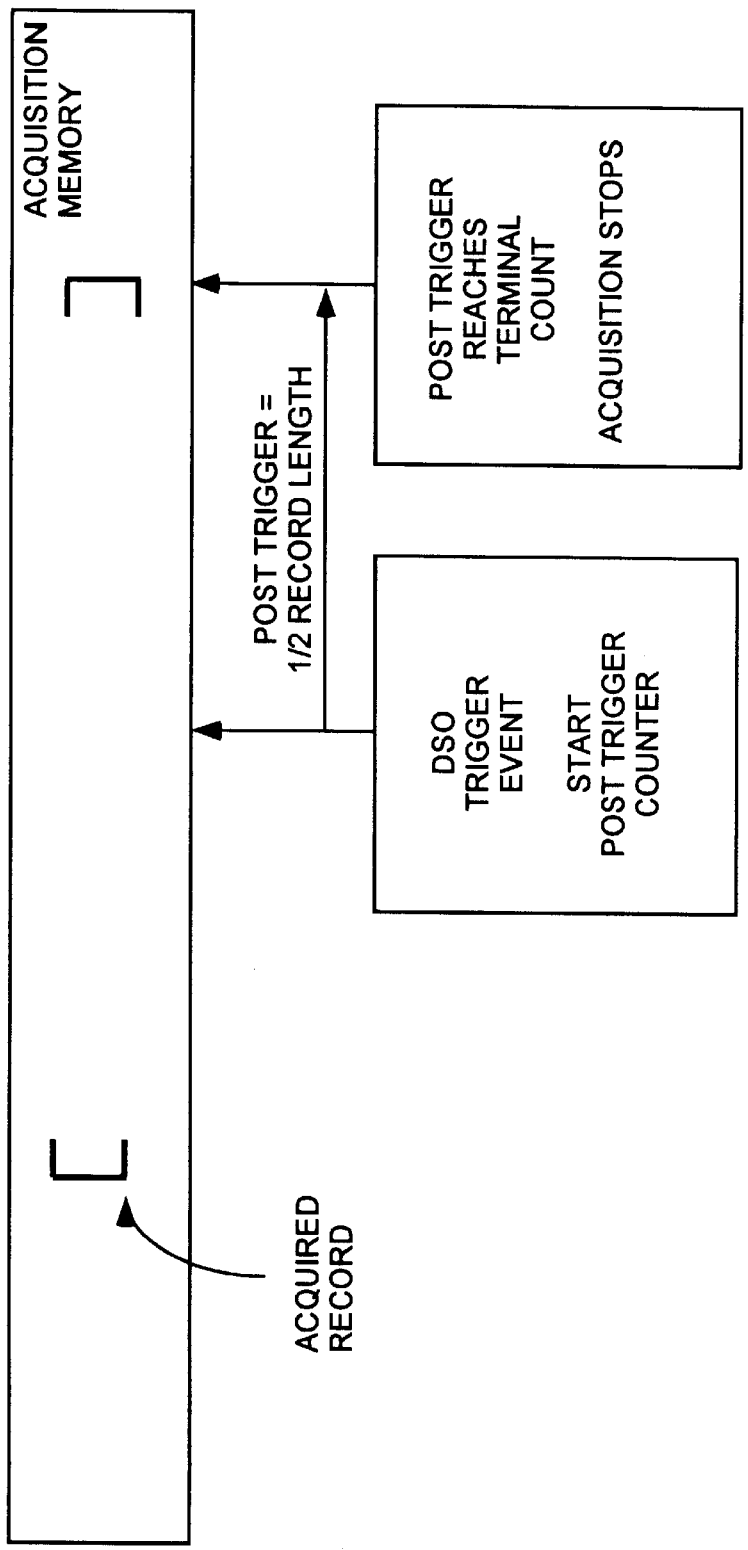
FIG. 3 is an illustration useful for understanding the operation of post triggering, known from the prior art.

Prior art FIG. 3 is an illustration of the operation of post trigger acquisition. Referring to FIG. 3, if the acquired data is to be centered about the trigger event, then the post trigger counter would be set to a value equal to one half of the record duration. When the user selects 50% post triggering from a selection menu, the post trigger counter is automatically set to the one-half record length value noted above. In operation, when a trigger signal is detected, the data record is not read from the point corresponding to the time when the trigger signal arrived. Rather, it is read from a point prior to the trigger signal arrival point which corresponds to the amount of time added to the post trigger counter.

Figure 4:
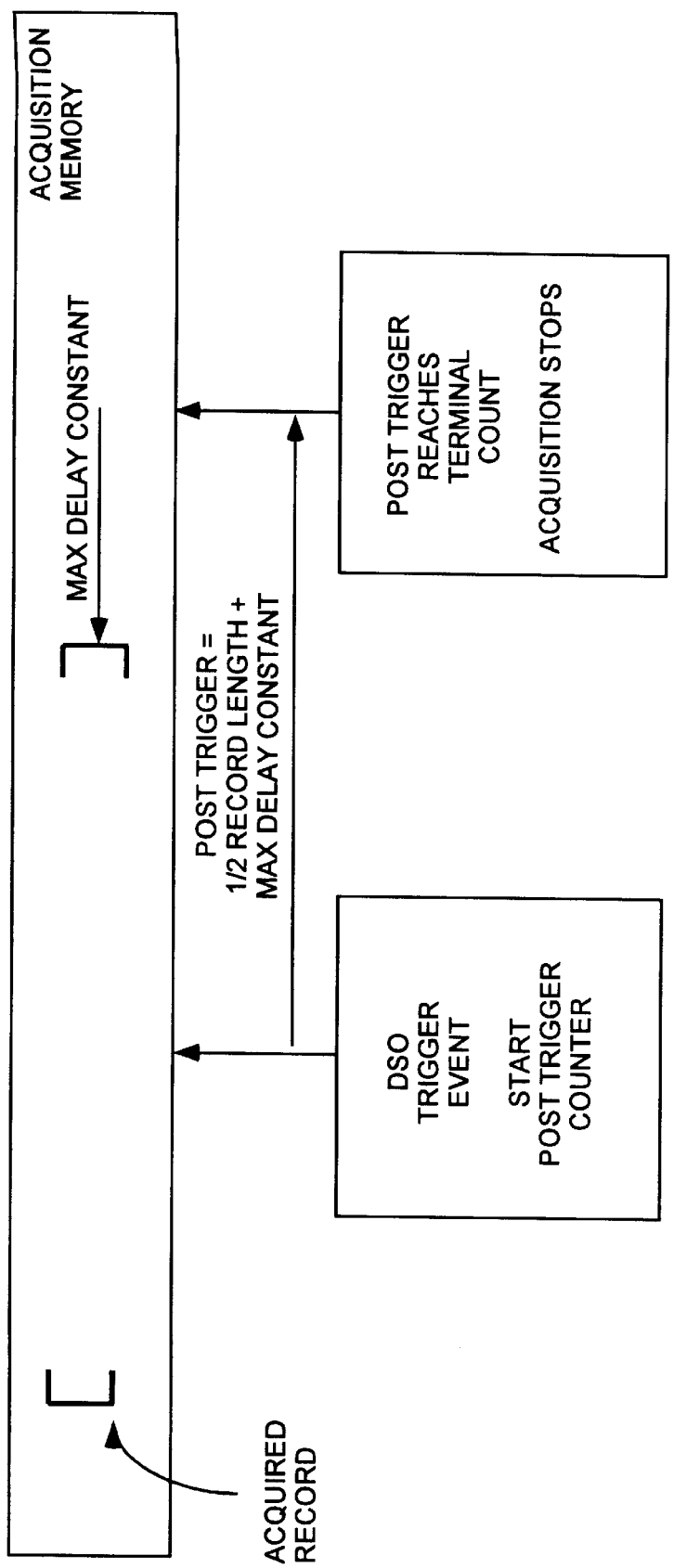
FIG. 4 is an illustration useful for understanding the operation of the subject invention.
Figure 5:
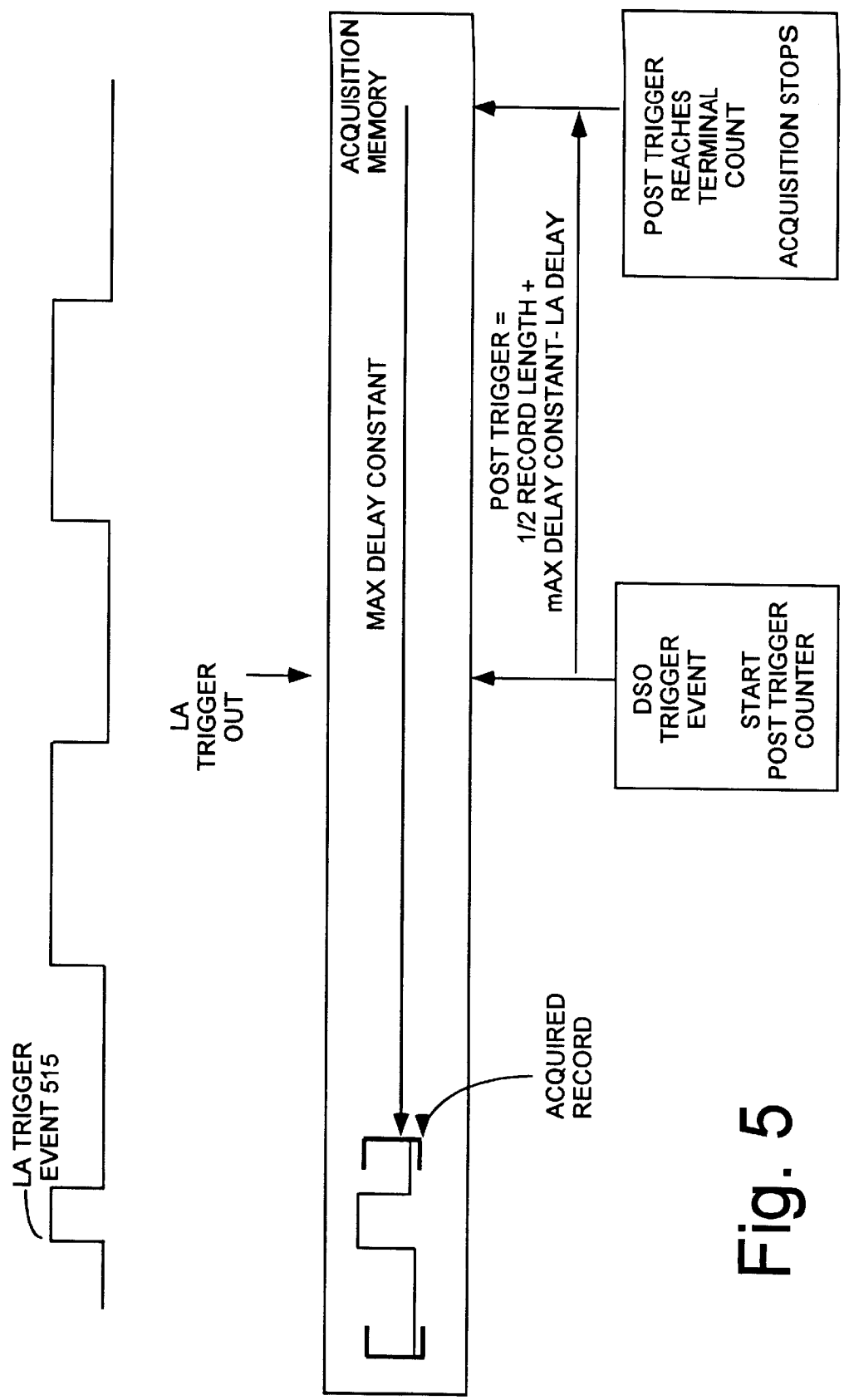
FIG. 5 is another illustration useful for understanding operation of the subject invention.

The subject invention will now be described with respect to FIGS. 4 and 5. In order to compensate for the delay in generating the TRIGGER OUT signal one needs to read from memory locations which were written into before the acquisition trigger signal occurred. Remember that the acquisition memory is being written to even though no trigger signal has yet been received. One would therefore think that all that is necessary to accomplish the task is to move the display window to a point ahead of the trigger point. This is essentially correct, but the process of moving ahead of the trigger point requires a subtraction to properly position the display window. In order to ensure that the subtraction produces a meaningful memory address, the stopping point of the acquisition memory is increased by an amount equal to 750 ns. If zero delay is required, then the display window is repositioned 750 ns earlier than the end of the acquisition period by subtracting 750 ns. Thus, by adding 750 ns, and subtracting 750 ns, the net effect is that FIG. 4 produces the same result as FIG. 3. With respect to FIG. 4, it is important to note that the subject invention increases the post trigger delay by a constant value (MAX DELAY CONSTANT) (750 ns) that is equal to the maximum amount of trigger delay that is to be compensated. The amount of acquisition memory required must be sufficient to accommodate the longest user settable record length plus the maximum delay constant to be added to the post trigger counter. When an acquisition is performed (not using the logic analyzer trigger signal for this example) the readout area is selected to be at a point which is ahead of the post trigger acquisition stopping point by exactly the amount of time that was added to the post trigger counter (750 ns), rather than reading the acquired data based on where the acquisition stopped. Note that the acquired record is still centered on the DSO trigger event, just as it was in FIG. 3. FIG. 4 is merely an explanatory step, helpful in understanding FIG. 5.

If the logic analyzer skew time (internal processing time) required between triggering on a logic analyzer event and generating the TRIGGER OUT signal is subtracted from the hardware post trigger counter delay, the effect is to position the read out of acquired record ahead of the DSO trigger event (i.e., ahead of the Logic analyzer TRIGGER OUT signal) and thus compensate for the internal delay of the logic analyzer. Note that as in FIG. 4, the 750 ns delay is added to the hardware counter to delay the stopping of the acquisition. However, unlike FIG. 4, the delay to be compensated for is then subtracted out of the value to be loaded into the hardware counter. Note that we are now adding and subtracting different values, in that the hardware counter is loaded with the 750 ns delay minus the delay to be compensated for (typically 380 ns) for a end point of 370 ns beyond the normal one-half record length, but the display window is repositioned back from the end point the full 750 ns. Thus, the display window is positioned 380 ns ahead of its normal position (i.e., 380 ns ahead of DSO trigger event), and the logic analyzer delay is fully compensated for. The operation of this delay compensation feature is illustrated in FIG. 5, wherein a logic analyzer trigger event 515 causes the logic analyzer to issue a TRIGGER OUT signal at some later time (typically 380 ns later). The DSO is triggered thereby and starts the post trigger counter. When in delayed trigger mode, the DSO adds the constant delay value (750 ns) minus the logic analyzer delay value (380 ns) to a value in the post trigger counter. When the read position (display window) is repositioned by 750 ns to the read out of the acquisition memory to the desired area, it effectively cancels the internal logic analyzer delay. Thus, the uncertainty formerly felt by the user is eliminated, and the oscilloscope automatically displays the desired acquisition data.

It is herein recognized that the DSO must be directed to perform in the above-described fashion, and that direction is preferably provided in the form of a menu selection (although a switch setting could also suffice). The user must also inform the DSO of the constant logic analyzer delay period to be compensated for (i.e. calibrate the oscilloscope). One such way would be to enter the delay time via a keyboard, knob rotation, or other data entry means directly. Another way would be to repeatedly apply an unambiguous trigger signal to both the oscilloscope and the logic analyzer, and dial backward through memory until the proper point is found. The user could then position a cursor on that spot and press a key (for example) to input data relating to the time between the DSO trigger event and the logic analyzer trigger event. It should be noted that pressing the key to input the data to the DSO would be unnecessary if the data were automatically saved on each change of step during the knob rotation. That is, the last position of the knob rotation is the last one saved and is used to indicate the final desired position. This, in fact, is a preferred embodiment.

It is also recognized that DSO controller circuitry 240 (having connections shown in phantom in FIG. 2) may be provided. Controller circuitry 240 can be programmed to automatically calibrate the DSO in response to the common signal logic analyzer trigger event signal repeatedly applied to one input of the DSO (and to the logic analyzer input) and the TRIGGER OUT signal applied a trigger input port of the DSO. In such a procedure, an automatic calibration selection would be provided in a menu. The user would be instructed to use a probe compensation signal from the DSO, or select an easily identifiable signal from his own board. In an iterative process, after each trigger and acquisition controller 240 would search for the edge of the unambiguous signal and would adjust the delay value to reduce the offset so that the proper data would be displayed. By providing a separate selection for an AUTO CAL function for this feature, one could turn the AUTO CAL feature off in the event that it proved to be inaccurate for a particular signal. All of the above methods of calibrating the delay compensation feature of the subject invention are deemed to lie within the scope of the following claims of the subject invention. It is noted that once the constant delay value has been entered into the DSO, then that value is taken into account no matter which time base setting is thereafter selected.

While the invention has been described with respect to a logic analyzer triggering a digital storage oscilloscope, it is herein recognized that the feature is equally useful when a logic analyzer is triggered by a DSO. In fact, the use of the invention is not intended to be limited to just logic analyzers and DSOs, and is equally applicable to other test and measurement instruments.

The term "controller" as used herein is intended to include to microcontrollers, microcomputers, microprocessors, dedicated ASICs, and the like.

What is claimed is:

1. Trigger delay compensation apparatus for use in a digital storage oscilloscope, comprising:

a trigger circuit for receiving a TRIGGER OUT signal generated from a logic analyzer in response to a logic analyzer trigger event signal, and starting a post trigger counter in response thereto;

data entry circuitry for entering data input by a user, said data being representative of a delay between a reception of said logic analyzer trigger event signal and said generation of said TRIGGER OUT signal by said logic analyzer;

a post trigger counter for stopping an acquisition of signal data upon expiration of a count of said post trigger counter;

a controller, coupled to said data entry circuitry and to said post trigger counter for receiving said delay representative data, and adjusting said count of said post trigger counter in a direction to compensate for said delay; and display circuitry for displaying a portion of said acquisition centered about said logic analyzer trigger event.

2. The apparatus of claim 1, wherein said delay representative data is directly entered by said user as numeric data.

3. The apparatus of claim 1, wherein said delay representative data is directly entered by rotation of a knob, said knob rotation a next acquisition to occur earlier in time than before said rotation.

4. The apparatus of claim 3, wherein said knob rotation is divided into steps, and said delay representative data is stored automatically after each step of said knob rotation.

5. The apparatus of claim 1, wherein said count of said post trigger counter is biased to a particular acquisition stopping point by adding a maximum delay value minus a delay value to be compensated for; and said display circuitry is controlled to display said portion of said acquisition centered about said logic analyzer trigger event, by reading from memory from a point equal to said stopping point minus said maximum delay value.

6. Trigger delay compensation apparatus for use in a first test and measurement instrument, comprising:

a trigger circuit for receiving a TRIGGER OUT signal generated from a second test and measurement instrument in response to a logic analyzer trigger event signal, and starting a post trigger counter in response thereto;

data entry circuitry for entering data input by a user, said data being representative of a delay between a reception of said second test and measurement instrument trigger event signal and said generation of said TRIGGER OUT signal by said second test and measurement instrument;

a post trigger counter for stopping an acquisition of signal data upon expiration of a count of said post trigger counter;

a controller, coupled to said data entry circuitry and to said post trigger counter for receiving said delay representative data, and adjusting said count of said post trigger counter in a direction to compensate for said delay; and display circuitry for displaying a portion of said acquisition centered about said second test and measurement instrument trigger event.

7. The apparatus of claim 6, wherein said delay representative data is directly entered by said user as numeric data.

8. The apparatus of claim 6, wherein said delay representative data is directly entered by rotation of a knob, said knob rotation also causing a next acquisition earlier in time than before said rotation.

9. The apparatus of claim 8, wherein said knob rotation is divided into steps, and said delay representative data is stored automatically after each step of said knob rotation.

10. The apparatus of claim 6, wherein said count of said post trigger counter is biased to a particular acquisition stopping point by adding a maximum delay value minus a delay value to be compensated for; and said display circuitry is controlled to display said portion of said acquisition centered about said logic analyzer trigger event, by reading from memory from a point equal to said stopping point minus said maximum delay value.

\* \* \* \* \*